United States Patent [19]

Jewett

[11] 4,417,944
[45] Nov. 29, 1983

[54] CONTROLLED HEAT SINK FOR CRYSTAL RIBBON GROWTH

[76] Inventor: David N. Jewett, Under Pin Hill Rd., Harvard, Mass. 01451

[21] Appl. No.: 301,639

[22] Filed: Sep. 14, 1981

Related U.S. Application Data

[63] Continuation of Ser. No. 166,026, Jul. 7, 1980, abandoned.

[51] Int. Cl.³ .............................................. C30B 15/06
[52] U.S. Cl. .............................. 156/608; 156/617 H; 156/DIG. 97; 156/DIG. 73
[58] Field of Search ............ 422/246; 156/608, 617 H, 156/617 SP, DIG. 64, DIG. 88, DIG. 97, DIG. 73; 75/135, 143; 65/83, 85, 264; 422/246, 249

[56] References Cited

U.S. PATENT DOCUMENTS 3,218,143 11/1965 Lajarte ........................ 156/617 SP
3,759,671 9/1973 Bleil ............................ 156/DIG. 97
4,000,030 12/1976 Ciszek .................................. 156/608
4,226,834 10/1980 Shudo et al. ............... 156/DIG. 97

FOREIGN PATENT DOCUMENTS 2633961 2/1977 Fed. Rep. of Germany ... 156/DIG. 97

OTHER PUBLICATIONS

Bleil, A. New Method for Growing Crystal Ribbons, Jl. of Crystal Growth 5, 99–104, Oct. 68.

Primary Examiner—Hiram H. Bernstein
Attorney, Agent, or Firm—Morse, Altman & Dacey

[57] ABSTRACT

A method and associated apparatus are disclosed for use in forming crystalline ribbons by pulling a ribbon in a generally horizontal direction from a pool of molten crystal-forming materials, such as silicon or the like. A heat sink is located above the surface of the molten material proximate to the crystal forming area to remove heat therefrom. The heat sink is cooled continuously and heat is transferred from the molten material to the heat sink by a gaseous thermally conductive medium maintained between the heat sink and the surface of the melt.

7 Claims, 7 Drawing Figures

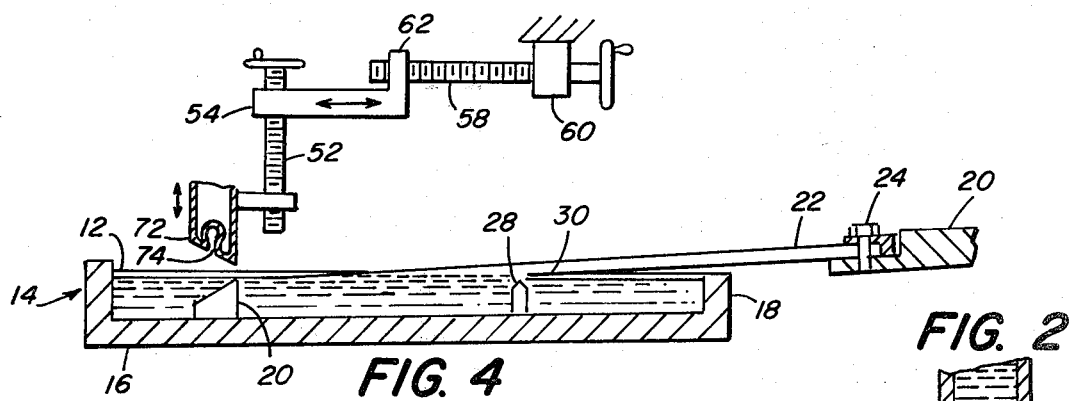
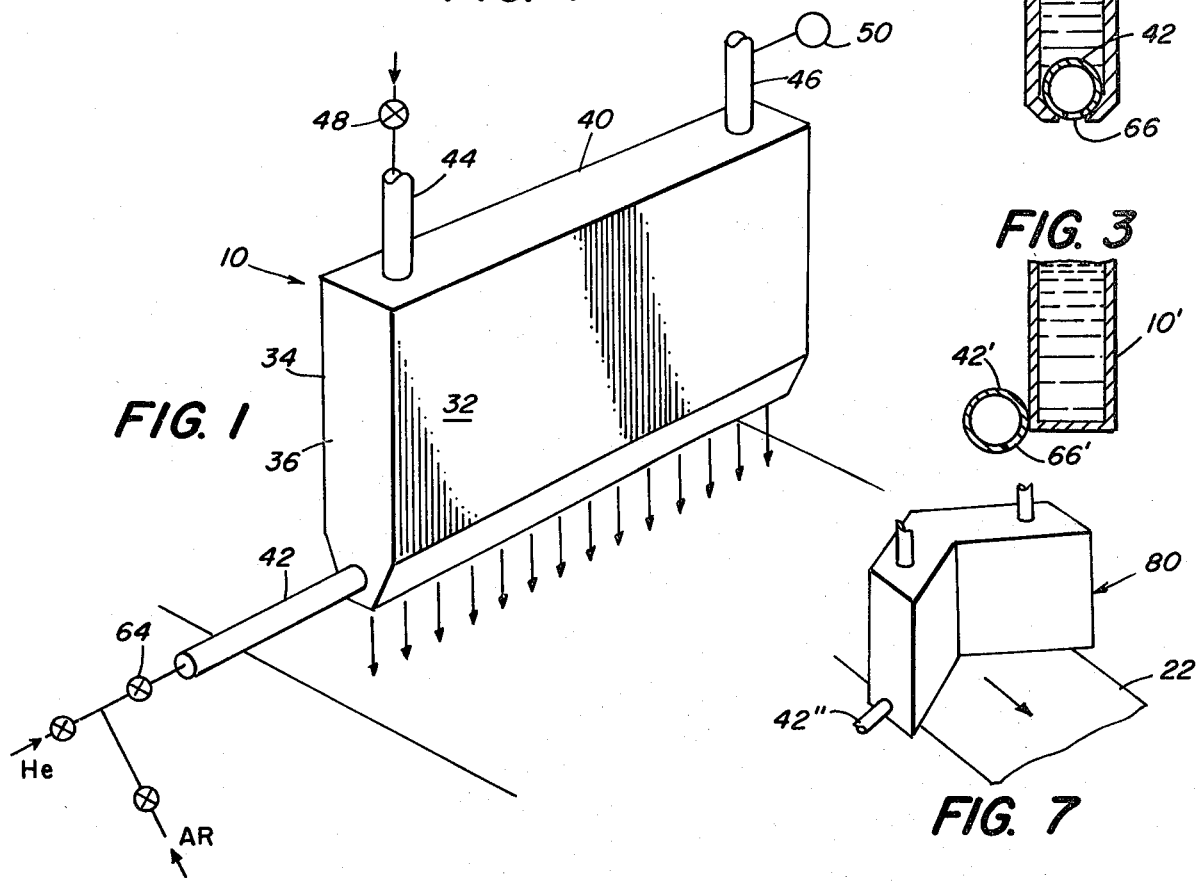
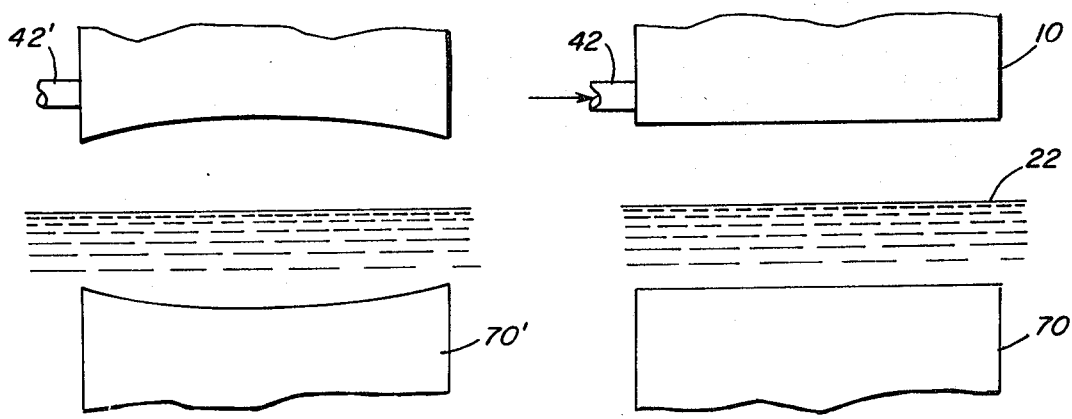

CONTROLLED HEAT SINK FOR CRYSTAL RIBBON GROWTH

This is a continuation of application Ser. No. 166,026 filed on July 7, 1980, abandoned.

BACKGROUND OF THE INVENTION

1. Field of the Invention

This invention relates generally to the production of crystalline ribbons on a continuous basis and more particularly is directed towards a novel method and associated apparatus for removing heat from the crystal growing surface area of a pool of molten crystalline material from which a crystalline ribbon is pulled in a generally horizontal direction.

2. Description of the Prior Art

In co-pending application Ser. No. 051,998 filed June 25, 1979, entitled "Method and Apparatus For Producing Crystalline Ribbons", there is disclosed a method and associated apparatus for pulling a ribbon of crystalline material such as silicon from a melt of the material, the ribbon being pulled in a generally horizontal direction from the surface of the melt. In the application there is disclosed a thermal impedance disposed below the surface of the melt to provide stability in the formation of the ribbon and to provide the proper temperature gradients conducive to the efficient formation of the ribbon from the molten materials.

It has been the practice to form single crystal semiconductive wafers for various electronic applications such as solar cells etc. by pulling a seed crystal slowly upwards in a generally vertical direction from a pool of molten silicon. In this technique a crystalline rod is grown which is then sliced transversly into thin wafers which may be further cut into smaller components. The technique is both slow and expensive in view of the waste involved in the various cutting operation. Considerable effort has been made in an attempt to form the semiconductive material from the melt directly into a ribbon in order to eliminate the waste and time involved in cutting rods into wafers. A thin, monocrystalline ribbon, once formed, may then be suitably scored into the desired pattern and several elements broken away from the ribbon for component use.

While the technique of drawing a ribbon directly from the melt has successfully produced single crystal ribbons, there still exist problems with respect to controlling the speed of crystal formation and the quality of the ribbon, particularly with respect to the uniformity of dimensions and operating stability of the system.

Accordingly, it is an object of the present invention to provide improvements in the method and associated apparatus for directly forming ribbons of crystalline material on a continuous basis.

Another object of this invention is to provide a novel method and associated apparatus for producing high quality ribbons of crystalline material such as silicon or the like at a high rate of production and of uniform dimensions.

A further object of this invention is to provide a novel means for removing heat at a controlled rate from the surface of the melt to enhance crystal formation.

SUMMARY OF THE INVENTION

This invention features the method of removing heat at a controlled rate from the surface of a pool of molten crystal-forming material from which a crystalline ribbon material is drawn in a generally horizontal direction, comprising the steps of positioning a fluid-cooled heat sink in spaced relation above the surface of the melt proximate to the crystal-forming portion thereof and maintaining between said surface and said heat sink a thermally conducting gaseous medium for conductively removing heat from said melt at a controlled rate.

This invention also features a controllable heat sink for use in growing crystalline ribbons from a melt, comprising a head of thermally conductive material mounted in spaced relation above the surface of the melt, cooling means operatively associated with the head for removing heat therefrom and gas delivery means connected to the head for maintaining between the head and the surface of the melt a thermally conducting gaseous medium for transferring heat from the melt to the head.

BRIEF DESCRIPTION OF THE DRAWINGS

FIG. 1 is a somewhat schematic perspective view showing a controllable heat sink made according to the invention, FIG. 2 is a sectional detailed view in side elevation of the heat sink shown in FIG. 1, FIG. 3 is a view similar to FIG. 2 but showing a modification thereof, FIG. 4 is a sectional view in side elevation showing another modification of the invention, FIG. 5 is a detailed front elevation showing the profiles of the heat sink and thermal impedence, FIG. 6 is a view similar to FIG. 5 and showing modified profiles according to the invention, and, FIG. 7 is a view in perspective showing yet another modification of the invention.

DETAILED DESCRIPTION OF THE PREFERRED EMBODIMENTS

In accordance with the present invention a crystalline ribbon is formed directly by placing a seed crystal on the surface of a pool of molten crystal-forming material such as silicon, or the like, the temperature at the surface being adjusted to produce solidification. The seed is then pulled from the pool surface at a slight positive acute angle over the upper edge of a wall at a rate commensurate with the rate of growth of the leading edge of the crystal in a direction opposite the pull direction. In practice, it is preferred that the pool of crystal-forming material be maintained at a shallow depth and at a relatively constant level to insure that the advancing edge of the ribbon at the solid/liquid interface remains stable.

Referring now to the drawings, the reference character 10 generally indicates a controllable heat sink mounted above the surface of a pool 12 of molten crystal-forming material contained in a crucible 14 comprised of a bottom wall 16 and surrounding side walls 18. In practice, it is preferred that the crucible be relatively shallow and appropriate heating elements may be provided in operative relation with the crucible in the manner suggested in the above-identified copending application. The apparatus also includes a ribbon puller 20 connectable to the end of a crystal ribbon 22 which is shown in FIG. 4 as being withdrawn from the surface of the melt at a slight positive angle from the horizontal over the wall of the crucible. The crystal puller engages the free end of the ribbon 22 by means of a clamp 24 or other device and is connected to a drive mechanism (not shown) that will withdraw the puller along with the ribbon at a substantially constant rate of speed matched to the speed of crystal formation.

In the preferred form of the invention the ribbon 22 is drawn up over the upper edge of scraper 26. The scraper 26 typically is formed from quartz and, preferably, is an upright rigid element the upper end of which forms into an edge 28 more or less even with the upper edge of a side wall 18, as best shown in FIG. 4. The ribbon is drawn over the scraper edge at a shallow angle from the pool surface and produces a raised meniscus 30 behind the scraper and between the ribbon and the liquid level above the melt. The leading edge of the ribbon, where the crystal formation takes place, moves in a direction reverse to that of the direction of pull.

The trough, as indicated, preferably is of a shallow configuration which tends to reduce the adverse effects arising from convection currents usually present in deep troughs which heretofore have been used in crystal pulling equipment. The configuration of the crystal growing apparatus in accordance with the present invention is such as to remove the growing region of the ribbon from the bulk of the melt reservoir. The trough, while shown as quite shallow, is connected by suitable means to a supply of melt so that the melt is replenished and the level of the melt remains substantially constant.

By drawing the ribbon at a slightly positive angle, for example 5% above the horizontal, from the pool surface, certain beneficial results are obtained. These include the elimination of the need to slightly overfill the crucible which would be required if the ribbon were to be drawn along a true horizontal path. It has been found to be extremely difficult to maintain the melt at a level which will allow the ribbon to be drawn horizontally from a crucible without the melt from overflowing. Coupled with this has been the problem of the ribbon freezing to the edge of the crucible. By drawing the ribbon at a slight upward angle these problems are overcome.

One of the most vexing problems in growing ribbons in this fashion has been in trying to stabilize the rate of crystallization and maintaining uniformity in the configuration of the crystal ribbon. It is critical in the formation of the ribbon that heat be removed from the melt in the area of crystallization at a steady and controlled rate that so that the melt will form into a crystal at a substantially constant rate and in the shape and dimensions desired.

Various types of cooling means have been proposed heretofore, but none of these has proven to be satisfactory. For example, cooling heads have been provided which directly contact the surface of the melt. While such devices provide an efficient means for removing heat, the fact that they contact the melt presents a number of difficult problems such as disturbing the surface of the melt and the resulting crystalline formation coupled with a tendency of the melt to freeze onto the cooling head. Other proposals have included the delivery of a gaseous coolant over the surface of the melt. This technique has several drawbacks in that it depends on convection for heat removal, which is not a particularly efficient way of removing heat, and, further, is difficult to control with precision. Also, too high a gas pressure would tend to disturb the surface of the melt so as to cause irregularities in the surface of the resulting ribbon.

In accordance with the present invention the heat sink 10 serves to conduct heat from the melt efficiently and without disturbing the surface of the melt. The heat sink 10 in the preferred embodiment is in the form of a housing serving as a heat exchanger and, in the illustrated embodiment, is generally rectangular, having a width generally coextensive with the width of the ribbon 22 being formed from the melt. The heat exchanger extends transversely of the length of the ribbon and, preferably is of a material having a high thermal conductivity. For this purpose metal such as nickel-coated copper or the like may be used to advantage. The housing is generally hollow being formed with front and rear walls 32 and 34, end walls 36 and 38 and a top wall 40. In the FIG. 1 embodiment the lower end of the housing is closed by means of a tube 42 extending along the lower portion thereof and sealed to the walls of the housing. Thus, the housing is a closed chamber through which a coolant such as water flows by means of inlet and outlet conduits 44 and 46, respectively. The conduits are connected to a suitable source of cooling water or the like which may be delivered by a pump, as required. In practice a valve 48 is provided in one of the conduits as a means for controlling the flow of coolant in the unit. Also, a thermometer or other temperature indicating device 50 may be provided in the discharge conduit 46 so that by proper manipulation of the valve 48 a substantially constant temperature may be maintained in the flow of the cooling water through the housing.

In order to provide flexibility in the positioning of the heat sink with respect to the melt, adjustment mechanisms may be provided for both raising and lowering the heat sink as well as for moving it horizontally. As shown in FIG. 4, vertical adjustments may be made by means of a lead screw 52 rotatably mounted to a fixed support 54 and provided with a follower 56 attached to the heat sink. Horizontal adjustments may be achieved by means of a horizontal lead screw 58 rotatably connected to a support 60 and provided with a lead screw 62 engaging the vertical lead screw support 54.

The tube 42 mounted at the lower end of the housing is connected through a valve 64 to a source of pressurized gas which is fed into the tube for delivery through a plurality of ports 66 spaced along the lower end of the tube, as best shown in FIG. 2. The ports are oriented to deliver gas into the gap between the lower edge of the heat sink and the surface of the melt. The gas used for this purpose is characterized by high thermal conductivity in order to provide a good thermal transfer medium between the melt and the heat sink. For this purpose, helium and argon or mixtures thereof have proven to be satisfactory. In practice both helium and argon may be delivered separately into the same tube 42, mixed at a rate required to optimize the desired effect. The cooling can be controlled by changing the mix ratio of helium and argon. It has been found that if the cooling action is too fast dendritic growth of the crystal may result.

Insofar as the heat sink 10 operates by maintaining a thermally conductive gas medium between the heat sink and the melt surface in order to provide a thermally conductive path to the heat sink, the flow of gas should be kept relatively low and should be sufficient only to maintain a sufficient amount of gas between the surface of the melt and the heat sink so as to provide a continuous thermal path entirely across the width of the ribbon at the crystal forming area of the melt. If too little gas is furnished the thermally conductive path will be dissipated because of natural losses arising from ambient air currents and other disturbances. If the gas flow is too great thermal conductivity will be reduced and the resulting cooling effect will be more by convection than by conduction. Thus, the proper amount of gas applied should be just enough to establish a good thermally conductive medium between the heat sink and the melt plus whatever is needed to replenish gas lost to the atmosphere.

In the utilization of the heat sink when first starting crystal forming procedures, a seed of crystal is attached to the end of the crystal puller and placed on the surface of the melt in close proximity to the heat sink. The heat sink itself is lowered close to the surface of the melt and the gas is introduced to the tube 42 while the coolant is circulated through the housing. The seed puller is started as the crystal formation commences and the heat sink is gradually raised to an optimum operating point at which crystal formation is stabilized at a steady growth. Minor adjustments may be made with respect to the position of the heat sink, as required.

As further aid in controlling the crystal formation, the crucible may be provided with a thermal impedance 70 mounted below the surface of the melt to provide stability in the formation of the ribbon and to provide the proper temperature gradients conductive to the efficient formation of the ribbon from the molten material. The thermal impedance 70 and its operation is more fully disclosed in copending application Ser. No. 051,998.

In addition to the impedance 70, other passive control elements may include thermal barriers along the bottom of the trough between the scraper 26 and the impedance 70 under both side edges of the ribbon. A thermal plateau may be located along the bottom of the trough within the rectangular area defined by the scraper 26, impedance 70 and any side thermal barriers whereby crystal formation is controlled as to width, thickness and stability.

Referring now to FIG. 3 of the drawings there is illustrated a modification of the invention, and, in this embodiment, a heat sink 10' of generally boxed configuration is provided with a gas tube 42' which is mounted along one corner of the lower edge of the heat sink rather than centrally recessed as in the principal embodiment. The tube 42' is provided with a number of ports 66 directly downwardly to a point below the heat sink.

Referring now to FIG. 4 there is illustrated another modification of the invention and, in this embodiment, a heat sink 10" is formed with a bevelled lower face 72 which is generally a mirror image of the upper bevelled face of the thermal impedance 70 of FIG. 4. A tubular passage 74 is formed in the bottom wall of the heat sink to define a passage for the gas and terminating in a slot or series of ports by means of which the thermally conductive gaseous medium is delivered into the gap between the heat sink and the melt.

Referring now to FIGS. 5 and 6 there are illustrated two different profiles of the heat sink as well as the thermal impedance. In FIG. 5 the heat sink 10 is shown with a straight lower edge parallel to the straight upper edge of the impedance 70. In FIG. 6, the corresponding edges of the heat sink and the thermal impedance are made somewhat concave in order to provide a variation in the control over the withdrawal of heat from the melt. In place of the concave configuration other shapes may also be utilized such as convex shapes and the like.

Referring now to FIG. 7, there is illustrated a further modification of the invention and, in this embodiment, a heat sink 80 is Vee-shaped in top plan view with the outer ends thereof extending forwardly in the direction of pull of the ribbon. It has been found that a heat sink of this configuration provides better contact over crystal formation than one having a transversly straight lower edge. An angular shaped heat sink such as shown in FIG. 7 causes the seed crystal to first spread out to the full desired width of the ribbon without any discontinuities and then to grow lengthwise at a substantially constant width. As an alternative configuration instead of an angular shape a curved shape may be used to advantage with the concave side thereof facing the direction of ribbon pull.

While the invention has been described with particular reference to the illustrated embodiment, numerous modifications thereto will appear to those skilled in the art. For example, while the invention is particularly useful in producing crystalline silicon ribbons, it could also be used in making ribbons of other crystal-forming materials such as nickel, for example. Preferably the material should be relatively stable in the melt form to facilitate forming it into a ribbon.

Having thus described the invention, what I claim and desire to obtain by Letters Patent of the United States is:

1. The method of forming a crystalline ribbon from a melt of crystal forming material of silicon composition, comprising the steps of
   (a) heating a melt of said material in a crucible having a shallow portion forming a shallow pool of said melt,
   (b) placing on the surface of said melt in said shallow pool a crystalline seed of said material,
   (c) controlling the temperature of said melt in said shallow pool to allow solidification of said melt at a free edge of said seed to form a ribbon while withdrawing said seed from said melt at a positive acute angle with respect to the melt surface at a speed commensurate with the longitudinal growth of said ribbon,
   (d) providing a site of attachment inwardly from the edges of said crucible for a meniscus formed by the melt from the lower face of said ribbon as it leaves the surface to said melt to reduce spillage and freezing thereof and controlling the temperature of said melt selectively within the melt below both side edges of said ribbon to control the width of said ribbon,
   (e) locating a heat sink above the surface of said melt and providing a thermally conductive gaseous medium between the melt surface proximate the growing end of said ribbon and said heat sink to control the growth of said ribbon,
   (f) separately and actively cooling said heat sink at a rate corresponding to the rate of heat transfer from said melt through said gaseous medium to said heat sink, and
   (g) replenishing the supply of melt in said shallow portion to maintain a substantially constant level therein.

2. Apparatus for forming a crystalline ribbon from a melt of crystal forming material, comprising
   (a) a crucible formed with a shallow portion adapted to contain a quantity of said melt in a shallow pool,
   (b) heating means operatively associated with said crucible for controlling the temperature of said melt, (c) seed holder and pulling means operatively associated with said crucible for drawing a crystal seed from the surface of said melt in said shallow pool as a ribbon at a small positive angle with respect to the melt surface at a longitudinal speed commensurate with the rate of solidification of said melt at the growing end of said ribbon, (d) meniscus attachment means mounted to said crucible in position to locate the upper edge thereof in close proximity to he surface of said melt to provide a stable lower edge for attaching a meniscus formed by the melt when said ribbon is pulled over said upper edge, (e) heat sink means disposed above the surface of said melt in close proximity to the growing end of said ribbon, (f) gas delivery means operatively associated with said heat sink means for delivery to and maintaining in the gap between said heat sink means and the melt surface a thermally conductive gaseous medium to provide a thermally conductive path between said melt surface and said heat sink means, (g) independent cooling means operatively connected to said heat sink for cooling said heat sink at a rate corresponding to the rate of heat transfer from said melt through said gaseous medium to said heat sink, (h) growth edge stabilizing means including an upright member mounted to the bottom of said crucible and formed with a contoured upper face, the uppermost forward portion of which is disposed closer to the melt surface than the lowermost rearward portion thereof, (i) position adjustment means operatively connected to said heat sink means for selectively changing the position thereof, (j) said meniscus attachment means being an upright member terminating in a horizontal straight edge extending transversely below the path of said ribbon to provide a stable locus of meniscus attachment, (k) said heat sink means including a liquid cooled housing and said gas delivery means including a tubular conduit connected to a source of said medium and mounted to said housing at the lower portion thereof, said conduit being formed with at least one discharge opening directed downwardly of said housing, and (l) said housing being mounted transversely across and above the path of travel of said ribbon proximate to the growing end thereof, the outer ends of said housing being disposed forwardly of the center portion thereof in the direction of pull travel of said ribbon.

3. Apparatus according to claim 2 wherein said medium is one of a group consisting of helium and argon and mixtures thereof.

4. Apparatus according to claim 1 wherein said heat sink means includes a fluid cooled housing formed with a lower portion that is substantially the mirror image configuration of the upper portion of said stabilizing means.

5. Apparatus according to claim 1 wherein said housing is Vee-shaped in plan view.

6. Apparatus according to claim 1 wherein the lower edge of said housing is parallel to the surface of said melt.

7. Apparatus according to claim 1 wherein the lower edge of said housing is curved.

* * * * *